METHOD OF PRODUCING THIN-LAYER ELECTRONIC ASSEMBLY

Original Filed May 29, 1969

METHOD OF PRODUCING THIN-LAYER ELECTRONIC ASSEMBLY

United States Patent Office 3,764,422
Patented Oct. 9, 1973

3,764,422
METHOD OF PRODUCING THIN-LAYER ELECTRONIC ASSEMBLY

Hans Koritke and Roland Haft, Munich, Germany, assignors to Siemens Aktiengesellschaft, Berlin and Munich, Germany Original application May 29, 1969, Ser. No. 829,048. Divided and this application Oct. 2, 1970, Ser. No. 77,692
Claims priority, application Germany, May 31, 1968, P 17 65 511.7, P 17 66 499.2; Sept. 12, 1968, P 17 91 104.5; Nov. 18, 1968, P 18 09 559.5
Int. Cl. C23f 1/02
U.S. Cl. 156—3 5 Claims

ABSTRACT OF THE DISCLOSURE

Covers an improved thin layer electronic circuit assembly for receiving electrical components which includes a non-conductive flexible plastic foil support having a thin layer circuit adherent to said support, which circuit includes conductor tracks for receiving said electrical components and contact surfaces for connection with other circuits. It also covers a method of preparing a plurality of said assemblies in a continuous manner by preparing a tape of said support and fixing thereon a plurality of said thin layer circuits in a continuous manner. The tape then is trimmed to provide the desired group of circuits.

CROSS REFERENCE TO RELATED APPLICATION

This application is a division of our earlier application, Ser. No. 829,048, filed May 29, 1969, now abandoned.

The production of thin layer circuits have made it possible to materially reduce the size of electrical systems. For example, the bases of such circuits are of a size order of a few square centimeters. However, because of the compactness of the individual components making up a thin layer circuit the manufacture of such systems is relatively costly and time-consuming. Thus, attempts have been made to simultaneously produce a plurality of systems utilizing one large carrier, and then dividing the carrier into the respective thin layer circuits. That is, it is desirable to carry out each process step so as to simultaneously produce a number of thin layer circuits on the carrier surface, which large carrier may be then trimmed to produce the individual circuits. In this manner the time required to process each individual circuit can be materially reduced.

Glass or ceramic has been mainly used as carrier materials. These materials however, have various disadvantages in that they are fragile, relatively high-prices and require careful treatment just prior to the application of the thin metal layers. Other systems include plastic carriers. Thus, for example, with the aid of photo techniques, conductor tracks are formed on a thermoplastic synthetic foil. Subsequently, metal used to define the circuit is deposited on the residual gelatin layer of the photo varnish. In a still further method, carbon resistances are applied on thin foils of hard paper and interconnected by printed conductor tracks. However, to date, none of these proposed methods have been completely successful, for one reason or the other, particularly in that they involve production of expensive individual units.

In order to offset the disadvantages of expensive individual production a method has been proposed whereby a series of supports are placed on a conveyor belt or chain and conducted consecutively to individual steps of the overall operation, such as by masking or coating by vaporizing material on the support. The conveying system is stopped when all the coating operations have been effected. However, even with this method the desired production rate per unit time is not considered efficient. Also, only rigid carriers such as glass or ceramic are used here.

Therefore, it becomes an object of the invention to provide a simple thin layer electronic circuit assembly which can be easily manufactured at a relatively low cost.

Another object of the invention consists in preparing said assembly such that optimum protection against environmental influences can be achieved.

A further object of the invention is to provide a method of preparing said assembly.

A still further object of the invention is to provide a continuous method of making a purality of thin layer electronic circuit assemblies.

Other objects, features and advantages of the invention will be readily apparent from the following description of certain preferred embodiments thereof, taken in conjunction with the accompanying drawings, although variations and modifications may be effected without departing from the spirit and scope of the novel concepts of the disclosure.

For a more comprehensive understanding of the invention, reference may be had to the drawings of which:

In its broadest aspects, the invention then provides an imporved thin layer electronic circuit assembly for receiving electrical components comprising a non-conductive flexible plastic foil support and a thin layer circuit attached to said support, which circuit includes conductor tracks for receiving said electrical components and contact surfaces for connection with other circuits. The invention is also concerned with a method of making said improved assembly by providing a high temperature stable, flexible plastic foil support and fixing thereon said thin layer circuits. Said method is preferably carried out by providing such support in the form of a tape and by fixing on the single tape a plurality of circuits in a continuous manner.

Figure 1:
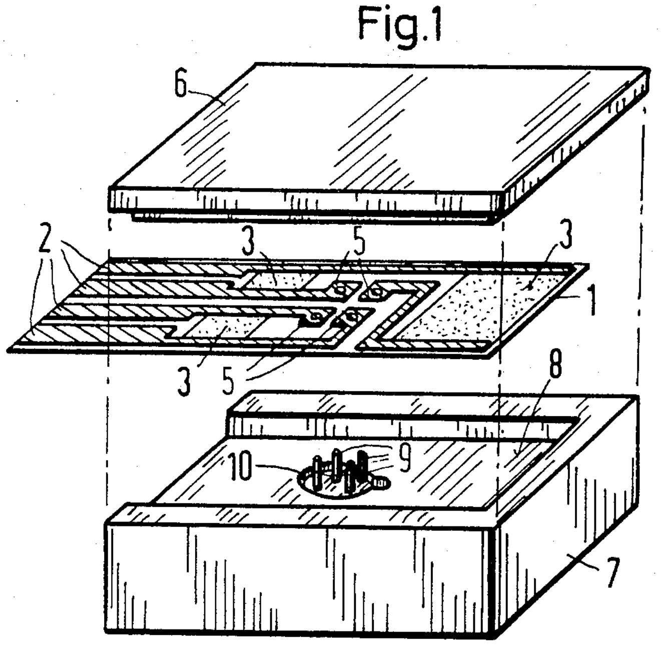
FIG. 1 is an enlarged plan view of the assembly including a housing for its mounting, said housing also being used to properly position pre-fabricated electrical components.

With specific reference to the drawings there is shown in FIG. 1 an electronic assembly of the invention and a housing for said assembly. Specifically, there is shown a flexible heat-resistant foil support member 1 having placed thereon thin layer circuit components comprising a thin layer circuit 3, which includes conductor tracks 5 and extended contact surfaces 2. There is also shown a housing for said assembly which includes the cover member 6 and base body 7. The base body includes a recess 8 which also opens on one side of base member 7. The recess is so dimensioned that the member 1 is precisely fitted into the recess on three sides. The base member 7 contains a further recess 10 into which an electrical component can be fitted, such as a transistor. As shown on the drawing, there is inserted in recess 10 connecting wires 9. The four connecting wires 9 are so installed that they project just slightly beyond the upper edge of the recess 10 and are in alignment with corresponding contact points 5a on the thin layer circuit. Also, as shown in the drawing, the member 1 is slightly longer on one side than the recess in the housing so that a portion of the foil part extends beyond the housing after mounting. The extension of the foil part is used for circuiting or connection with other assemblies and contains extended contact surfaces 2.

A critical aspect of the invention is, of course, the particular construction of the flexible plastic foil support. These supports should have a high temperature resistance property. Resort to plastic supports of this type avoids all the disadvantages of known substratum material such as glass and ceramics.

A greatly preferred support material is a polyimide which has a particularly high temperature resistance. Other advantages lie in its low weight, mechanical and thermal strength and excellent flexibility. Moreover, a foil or support of this type can be made quite thin without adversely effecting the electrical properties of layers spaced thereon or the adhesive capacity of the polyimide. Moreover, the polyimide layer may be directly coated without cleaning such as by washing or subjecting it to a gas discharge.

As noted above, it is greatly preferred that all the contact surfaces be arranged as parallel narrow tapes on the extension of the support foil. This facilitates connection with other external circuits by suitable connective means. This also allows the contact surfaces to be simultaneously galvanized, e.g. tin-plated in a dipping bath. In addition, this embodiment obviates fastening of connecting wires to the contact surfaces which can be thus directly linked in with other circuits through contact of the extended parallel narrow tapes with these circuits. A further advantage in this design consists in the fact that the number of the necessary soldering points is materially reduced and handling is facilitated.

As a further embodiment of the invention, to protect the components against external influences, it is desirable to coat the assembly with a protective varnish with the exception of the contact surfaces used for outer circuiting. The varnish may be applied by coating, dipping, spreading, etc.

By installing the assembly in the housing better protection is accomplished. Also, it is advantageous to design the housing in such a manner so that components like transistors, diodes, prefabricated resistors, capacitors, etc. can be soldered in later. The housing should be designed so that the components are so positioned so that they exactly contact corresponding contact surfaces of the assembly. This eliminates time-consuming calibration via a microscope.

One particular advantage in using a thin plastic foil of the type described above lies in allowance of a subsequent soldering step. Since many components cannot withstand temperatures used during soldering in a continuous furnace without extensive damage, this soldering method cannot frequently be applied. The invention obviates this drawback by the fact that the soldering heat can be guided from the rear side of the foil through the foil to the soldering joints. Therefore, only the connecting wires of the components are heated for a short time while the components themselves remain unheated. Thus, for example, a soldering iron is simply placed on a reverse side of the support or substratum foil in the housing whereby appropriate soldering is achieved without injuring the expensive components in the housing. During or after soldering of the components both housing parts are then simply made adherent to each other such as by use of a simple adhesive.

The housing itself should be made of a heat-resistant insulating material. This gives the overall unit an even greater versatility in addition to advantages of higher charge capacity, simple mounting, etc., already achieved. It is necessary that the housing be made up of insulating materials in order to resist heating during soldering and during operation of the entire unit. Generally, the insulating material should be one which will adequately resist a temperature of around 200° C. However, the insulating material must be chosen so that it does not in some way detrimentally effect the electrical components.

The housing, for example, may be made of ceramic or silicone materials. Silicones are highly advantageous in that they may be easily molded such as by injection molding. This further simplifies the production of the housing itself. Another housing unit may be made up of polytetrafluoroethylene. This material is also very stable over a relatively high temperature range. In addition, such materials as epoxy resins or polyesters may be used to form the housing, though the latter materials are not as temperature-stable as are some of the first-discussed construction materials.

Figure 2:
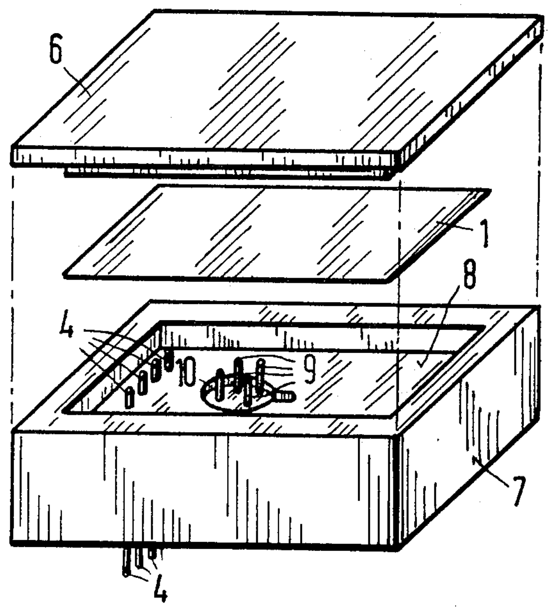
FIG. 2 is a further enlarged plan view of the assembly of the invention to be mounted in a housing, which housing also contains pins for outer circuiting.

Turning again to the drawing, FIG. 2 shows a slightly modified assembly. Here, the foil 1 is shown without a circuit and does not extend beyond the housing. The housing base member 7 has a recess 8 which is not opened at one side thereof. The foil 1 then fits exactly according to dimensions into the recess 8. Then a conductor such as a transistor with four connecting wires 9 may be inserted as an additional component into the recess 10. Firmly inserted metal pins 4 are placed into and through the housing part 7 for outer circuiting, with said pins protruding into recess 8 only far enough so that a satisfactory solder connection may be made between the thin layer circuit and the pins 4. In this particular embodiment one realizes increased precision due to the careful fixing of the foil 1 in relation to the components to be inserted additionally. In the first embodiment discussed above, a simpler contacting with outside circuitry is attainable.

Figure 3:
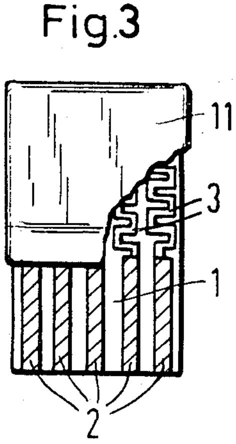
FIG. 3 is a plan view of a further embodiment of the assembly in the invention which has included therein a protective coating.

FIG. 3 shows, as an additional embodiment, an assembly plan view which is provided for protection against environmental influences by means of application of a protective varnish. The entire assembly is protected with a protective varnish coating 11 with the exception of contact surfaces 2. As an aid for the understanding of the reader, the assembly coating is partly broken away to expose the actually coated circuit members 3. As shown, the contact surfaces 2 are all on one side of the carrier foil 1.

Figure 4:
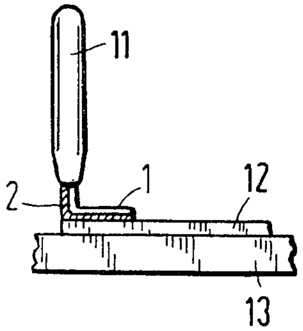
FIG. 4 is a side plan view of the assembly mounted in a further circuit such as a conventional printed circuit plate.

As shown in FIG. 4, the assembly is conveniently connected with the remainder of the circuit. In this side view the extended side of the foil 1 is bent at right angles. The tin plated contact surfaces 2 are then placed on correspondingly designed conductor tracks 12 of a conventional printed circuit plate 13 such that the actual circuit is protected by the protective varnish coating 11 from the air. Other methods of fastening the assembly to other circuitry is possible. However, as is evident, the entire contact surfaces for the outer circuiting are already an inseparable part of the entire circuit and one need not apply additional elements.

Figure 5:
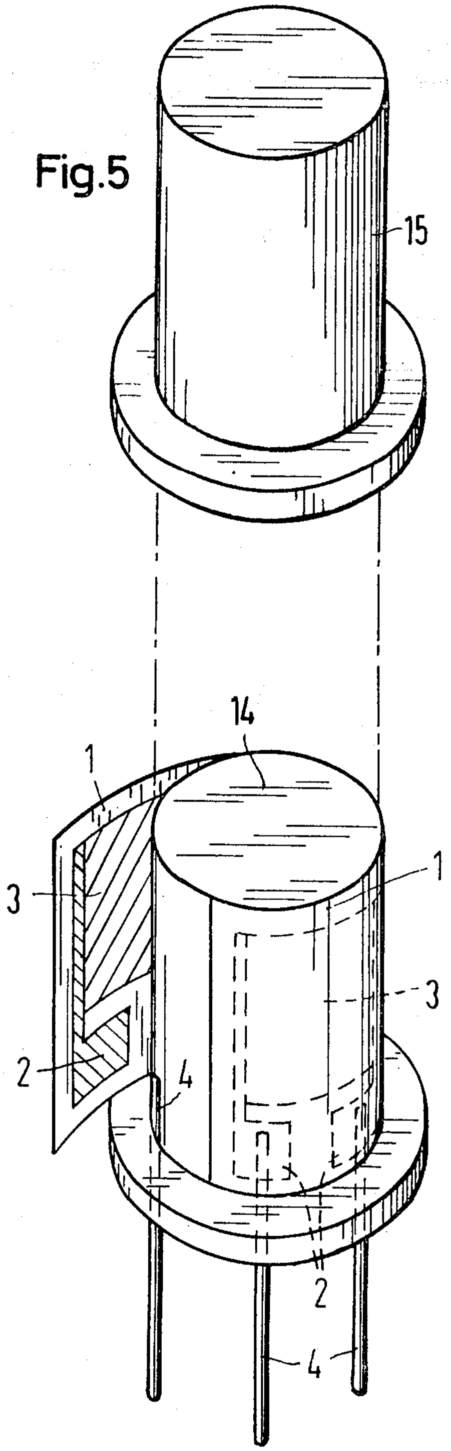
FIG. 5 is a plan view of the assembly mounted in a circular housing.

In a further embodiment shown in FIG. 5, a circular housing is shown. Again, a thin layer circuit 3 is applied to a plastic foil 1 and contact surfaces 2 are provided at the lower edge of the foil 1. Contact surfaces are placed in contact with the upper ends of connecting pins 4 held by housing base 14. This is accomplished by so rolling the foil that the coated side is placed inwardly around the housing base thus contacting connecting pins 4. In order to hold the electronic assembly in place a protective cap 15 is placed over base 14 and support foil 1. It is evident the height and diameter of the housing, number of connecting pins, etc., may be varied. The space-saving round housing possesses a number of advantages. First of all, the assembly is easily encased in the housing by simply rolling the foil such that the contact surfaces of the thin layer surfaces are affixed upon the connecting pins at the edge of the inner cylindrical housing base so that the upper ends of the contact pins are so disposed to contact the thin layer circuit. After rolling on the flexible assembly the protective cap is placed on the base containing the assembly and thus holds the assembly in a proper spacial arrangement.

If the protective cap is made of metal, due to its close thermal contact with the foil carrying the thin layer components, heat generated by resistors can easily be transferred to the atmosphere. Thus, one can realize higher resistances than those of conventional thin layer circuits.

The method of the invention is broadly carried out in a similar continuous manner by processing the plastic flexible foil or support in the form of a long tape. Due to the flexibility of the support such as method of processing can be carried out whereby a number of equivalent circuits may be produced simultaneously. Thus, the processing time of any one individual circuit is considerably reduced. In such manner, resistance and conductor tracks may be continuously applied to the tape via conventional methods such as by dusting on the metal or vaporizing the metal on the substrate tape. Chrome, nickel, or tantalum are particularly appropriate materials to form resistance tracks while gold is used in general to form conductor tracks.

The following is a typical operation comprising a number of steps whereby the plastic foil support is thus continuously treated to produce a plurality of individual circuits.

In the first step a stable resistance layer is applied to the continuously moving foil by coating the foil with materials of the type just mentioned. As is known, it is particularly advantageous to apply as uniform a resistance layer as possible upon the foil. This uniformity can be increased by several methods already known, particularly via careful control of the passage speed of the foil and control of the rate of the material being evaporated upon the foil. In some cases the surface resistance may be non-uniform and in order to reduce the fluctuation of the resistance values over the entire length of the foil it is proposed that the resistance layer be applied in a number of coatings. This then compensates for any fluctuations in resistance which may occur during the continuous process.

The second step in the invention lies in the application of a tightly adherent, high conductive layer which may be galvanized, e.g. tin-plated. This layer, after further processing, will comprise the contact surfaces and conductor tracks. Again, known materials for this use may be applied.

The next step involves a further coating with a photo varnish. Such step is particularly preferred in that this obviates resort to expensive and sensitive vaporization masks or coatings and reduces overall wear. Again, the coating of the foils with photo varnish is carried out as is known in the film industry through a continuous process.

Thereafter, the photo varnish layer is exposed to provide a pattern for the contact points and conductor tracks. Generally, this step, as carried out in the past, consists of moving the film, in this case the foil, in an intermittent manner. The number of stops required during each individual exposure thus produces a substantial degree of mechanical wear. In order to overcome this drawback it is proposed to fasten the photo mask to a translucent roller which is placed adjacent to the photo layer and then rolled thereon. A luminous source is then placed inside the translucent roller. In order to simply adjust the photo mask, both the stationary and rotary types, for each individual operation, perforation holes are punched into the foil. The holes may also be used at the same time to help convey the film much like putting a film through a projector.

The next steps involve conventionally developing the exposed varnish, selectively etching the contact and conductor tracks out of the conductive layer and removing residual varnish.

The steps running from removal of residual varnish to selective etching are then repeated to etch the lower metal resistance coat.

Lastly, the tape is immersed in a tin plating bath and trimmed to form the individual systems of desired dimensions.

The following example specifically illustrates the operation of the invention. It is understood, of course, that this example is merely illustrative and that the invention is not not to be limited thereto.

Example 1

A polyimide foil is coiled in the form of a tape, placed on a reel and the beginning of the tape attached to an empty reel, analogous to the method of film projection. After air is pumped from the coating apparatus, the foil is allowed to unwind from the supply reel and coiled at the same time on the empty reel, while being coated with a resistive layer. Tantalum or chrome-nickel alloy may be used as the resistance layer. The application is carried out under reduced pressure by a vaporization step or by dusting one of the materials on the tape. Other metals or combination of metals may also be chemically precipitated on the polyimide foil step. Likewise, chemical baths may be employed here. As mentioned above, to increase the uniformity of the applied coat the foil may be repeatedly subjected to this coating operation simply by having the reel move forward then backward during the coating operation.

After this basic or prime coat has been applied to a sufficient thickness and in a uniform film, a low ohmic coat is applied which will subsequently form the conductor track contacts. The just-discussed methods ranging from vacuum evaporation to galvanic metallizing are also applicable here, which again can be carried out in a continuous manner.

Photo varnish is then applied to this second coat and exposed to provide a pattern for the conductor tracks and contacts. Following the development of the exposed varnish the topmost metal coat is etched with the aid of a selective etching agent. At the end of this step the residual varnish is removed. Again the just-discussed steps are most expediently carried out in a continuous manner. The varnish operation etc. is then repeated and then the low resistance metal coat is etched. Following the above steps it is then desirable to tin-plate the contacts by passing the foil tape through an immersion tin-plating bath prior to cutting it up into individual pieces, the size of which will depend upon the particular system with which they are employed.

It will be understood that modifications and variations may be effected without departing from the spirit and scope of the novel concepts of the present invention.

We claim as our invention:

1. A method of making an improved thin layer electronic assembly by coating a high temperature stable, flexible plastic foil support in the form of a tape with a resistance layer, applying a conductive layer to provide contact surfaces and conductor tracks, photo-etching the conductive layer and the resistance layer respectively to form a pattern of electrical components and trimming said produced tape to provide a plurality of individual circuits of desired size, comprising the steps of metalizing said tape in a continuous manner by a vacuum process, coating said conductive layer with a photo-varnish, exposing said photo-varnish to provide a pattern for said contact surfaces and conductor tracks, developing said exposed photo-varnish, selectively etching said conductive layer, removing the residual varnish after etching, repeating the steps beginning with the coating with a photo-varnish, etching the innermost resistance layer and removing the residual photo-varnish, during each of the above said steps unwinding the tape from a supply reel and winding the tape onto a receiving reel, and cutting the tape into individual pieces.

2. The method of claim 1, comprising a final step of tin plating said conductor tracks and said contact surfaces by passing the foil tape through an immersion tin plating bath.

3. The method of claim 1, wherein the exposure of the photo-varnish is accomplished by the steps of feeding said photo-varnish coated tape about a rotary drum type mask embodying light transmitting areas corresponding to the desired pattern to be reproduced on said tape.

4. The method of claim 1 wherein the step of applying a resistance layer is repeated a plurality of times in order to produce a layer of uniform thickness.

5. The method of claim 1, comprising the step of perforating the tape to provide holes to facilitate feeding the tape in a continuous manner and adjusting with respect to the applied photo mask.

References Cited

UNITED STATES PATENTS

| | | | |
|---|---|---|---|
| 2,662,957 | 12/1953 | Eisler | 156—3 X |
| 2,745,170 | 5/1956 | Nims | 156—3 X |
| 2,849,298 | 8/1958 | Werberig | 156—3 |
| 3,061,911 | 11/1962 | Baker | 156—3 X |
| 3,217,209 | 11/1965 | Kinsella et al. | 156—3 X |
| 3,423,205 | 1/1969 | Skaggs et al. | 156—3 X |
| 3,423,260 | 1/1969 | Heath et al. | 156—3 |
| 3,493,475 | 2/1970 | Neugebauer et al. | 156—3 X |
| 3,179,634 | 4/1965 | Edwards | 260—78 |
| 3,499,220 | 3/1970 | Hintz et al. | 29—626 |
| 3,562,036 | 2/1971 | Travis | 156—3 |

WILLIAM A. POWELL, Primary Examiner

U.S. Cl. X.R.

156—8; 174—68.5